(12) United States Patent
Patriche

(10) Patent No.: US 6,608,762 B2
(45) Date of Patent: Aug. 19, 2003

(54) MIDPLANE FOR DATA PROCESSING APPARATUS

(75) Inventor: Dorinel Patriche, Chateauguay (CA)

(73) Assignee: Hyperchip Inc., Montreal (CA)

( * ) Notice: Subject to any disclaimer, the term of this patent is extended or adjusted under 35 U.S.C. 154(b) by 0 days.

(21) Appl. No.: 09/870,842

(22) Filed: Jun. 1, 2001

(65) Prior Publication Data

US 2002/0181217 A1 Dec. 5, 2002

(51) Int. Cl.$^7$ ............................................... H01R 12/16
(52) U.S. Cl. ........................ 361/788; 361/796; 361/799; 439/65
(58) Field of Search ................................ 361/788, 799; 439/65, 79, 248, 533; 367/303.1, 482.1; 340/825.79, 825.06–825.09

(56) References Cited

U.S. PATENT DOCUMENTS

| | | | |
|---|---|---|---|
| 4,686,607 A | | 8/1987 | Johnson |
| 4,703,994 A | * | 11/1987 | Leib et al. ..................... 359/19 |
| 4,708,660 A | * | 11/1987 | Claeys et al. ................ 439/248 |
| 4,876,630 A | | 10/1989 | Dara |
| 5,062,801 A | | 11/1991 | Roos |
| 5,296,748 A | * | 3/1994 | Wicklund et al. ............ 326/101 |
| 5,352,123 A | | 10/1994 | Sample et al. |
| 5,541,586 A | * | 7/1996 | Wise ........................... 340/2.2 |
| 5,887,158 A | | 3/1999 | Sample et al. |
| 5,993,259 A | | 11/1999 | Stokoe et al. |
| 6,116,926 A | | 9/2000 | Ortega et al. |
| 6,146,202 A | | 11/2000 | Ramey et al. |
| 6,163,464 A | * | 12/2000 | Ishibashi et al. ............. 174/261 |

FOREIGN PATENT DOCUMENTS

| | | |
|---|---|---|
| CA | 2283953 | 3/2001 |
| EP | 0 560 550 B1 | 7/1997 |
| EP | 0 907 225 A2 | 4/1999 |
| EP | 1 047 157 A2 | 10/2000 |
| WO | WO 98/35408 | 8/1998 |
| WO | WO 98/35409 | 8/1998 |

* cited by examiner

Primary Examiner—Albert W. Paladini
Assistant Examiner—Tuan Dinh (57) ABSTRACT

A data processing apparatus, having a first plurality of circuit boards arranged generally side-by-side and a second plurality of circuit boards arranged generally side-by-side, the first plurality of circuit boards being mounted to the second plurality of circuit boards by a midplane. The midplane has a first main surface, a second main surface and a plurality of connector elements, each connector element including an array of electrical couplers that extend generally transversally to the main surfaces of the midplane. The array of electrical couplers connect data contacts on one circuit board mounted to the first surface of the midplane to data contacts of another circuit board mounted to the second surface of the midplane. The connection between the circuit boards is such that each data contact on one circuit board and the corresponding data contact of the other circuit board are in physical contact with a common electrical coupler.

26 Claims, 9 Drawing Sheets

MIDPLANE FOR DATA PROCESSING APPARATUS

FIELD OF THE INVENTION

The present invention relates to a midplane to which circuit boards of a data processing apparatus are mounted.

BACKGROUND OF THE INVENTION

It is known in the art relating to the manufacture of data processing devices, such as routers, to use a midplane architecture for interconnecting circuit boards. In the specific example of a router, a set of port circuit boards connects to a set of switching circuit boards through a midplane. The midplane is itself a circuit board with two main surfaces. The port circuit boards are mounted to one main surface of the midplane while the switching circuit boards are mounted to the other surface of the midplane. The midplane establishes electrical pathways between the main surfaces such that data signals from the port circuit boards can travel to the switching circuit boards.

Known midplane structures have a series of insulating layers on which are formed patterns of electrical conductors by photolithography. Vias interconnect electrical conductors on different layers, when such interconnection is necessary.

One drawback of this prior art midplane design is the poor signal transmission performance when the signals exchanged between the port and switching circuit boards are high data rare signals. One possible approach to alleviate this drawback is to use special driver circuits on the circuit boards to condition the signals and compensate for possible corruption generated during the transmission, however this approach is not entirely satisfactory.

Against this background, the need to conceive an improved midplane design that offers a superior signal transmission performance, by comparison to prior art designs, is clearly apparent.

SUMMARY OF THE INVENTION

Under a first broad aspect, the invention provides a data processing apparatus, having a first plurality of circuit boards arranged generally side-by-side and a second plurality of circuit boards arranged generally side-by-side, the first plurality of circuit boards being mounted to the second plurality of circuit boards by a midplane. The midplane has a first main surface, a second main surface and a plurality of connector elements, each connector element including an array of electrical couplers that extend generally transversally to the main surfaces of the midplane. The array of electrical couplers connect data contacts on one circuit board mounted to the first surface of the midplane to data contacts of another circuit board mounted to the second surface of the midplane. The connection between the circuit boards is such that each data contact on one circuit board and the corresponding data contact of the other circuit board are in physical contact with a common electrical coupler.

The advantage of this design resides in the improved signal propagation performance that results from the direct connection between corresponding data contacts through common electrical couplers.

In a specific and non-limiting example of implementation, the electrical couplers are in the form of vias. Alternatively, the electrical couplers are in the form of pins projecting from the main surfaces of the midplane. It is also possible to use electrical couplers that are in the form of vias on one of the main surfaces of the midplane and in the form of pins projecting from the other main surface.

Under a second broad aspect, the invention provides a midplane for a data processing apparatus. The midplane has a generally planar body defining a first main surface and a second main surface. A void area extends from the first main surface to the second main surface. Connectors are formed on both main surfaces and they are remote from the void area. The connectors on each main surface are capable of engaging circuit boards. The connectors layout is such that the circuit boards; on each main surface are side-by-side and the circuit boards on the first main surface are in a non-parallel relationship with the circuit boards on the second main surface. In one form of implementation, the connectors are electrical connectors, and establish electrical connections with terminals on the circuit boards. In addition to their electrical connection capability, the electrical connectors also provide a mechanical fastening function to retain the circuit boards to the midplane. More specifically, each electrical connector is in the form of a socket that receives a mating tongue formed on the corresponding circuit board, the socket arid tongue having mating electric terminals that physically contact one another to establish the electrical connection. Note that the gender can be reversed without departing from the spirit of the invention, more specifically, the electrical connectors can be in the form of projecting tongues that engage corresponding sockets on the circuit boards. Another possibility is to provide connectors without electrical connection function such connectors provide only a mechanical fastening function. Yet, another possibility is to provide connectors that offer only electrical connection function without a mechanical fastening function. Under this realization, the circuit boards are fastened to the midplane by an agency independent from the electrical connectors.

Under another aspect, the invention provides a data processing apparatus, having a first plurality of circuit boards arranged generally side-by-side, a second plurality of circuit boards arranged generally side-by-side and a midplane having a first main surface and a second main surface. The first plurality of circuit boards is mounted to the midplane at the first main surface and the second plurality of circuit boards is mounted to the midplane at the second main surface. The first plurality of circuit boards is in a non-parallel relationship relative to the second plurality of circuit boards.

The midplane has a void area extending completely from the first main surface to the second main surface. A first circuit board from the first plurality of circuit boards intersects the void area at the first main surface and a second circuit board from the second plurality of circuit boards intersects the void area at the second main surface. Electrical pathways extend from the first circuit board to the second circuit board through the void area, the electrical pathways establishing a data communicative relationship between the first circuit board and the second circuit board.

BRIEF DESCRIPTION OF THE DRAWINGS

A detailed description of examples of implementation of the present invention is provided herein below with reference to the following drawings, in which.

In the drawings, embodiments of the invention are illustrated by way of example. It is to be expressly understood that the description and drawings are only for purposes of illustration and as an aid to understanding, and are not intended to be a definition of the limits of the invention.

For clarity, the same components appearing in different FIGS. of the drawings are designated by the same reference numerals.

DETAILED DESCRIPTION

Figure 1:
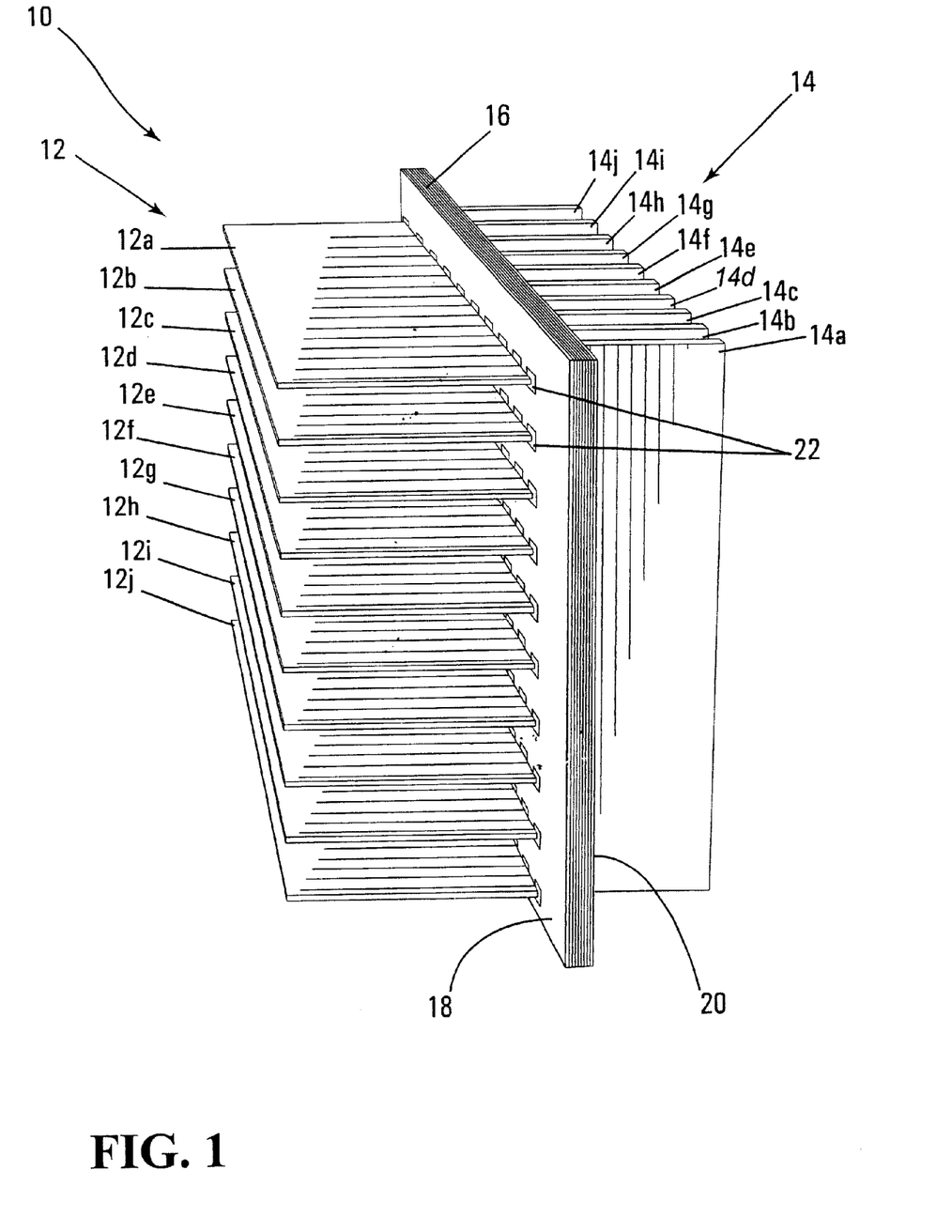
FIG. 1 is a simplified perspective view of a data processing apparatus according to non-limiting example of implementation of the present invention.

FIG. 1 illustrates at 10 a data processing apparatus constructed in accordance with a non-limiting example of implementation of the present invention. The data processing apparatus 10 is a router and includes three main components, namely a first set of circuit boards 12 having individual circuit boards 12a, 12b, 12c, . . . 12j a second set of circuit boards 14 having individual circuit boards 14a, 14b, 14c, . . . 14j and a midplane 16 between the first set of circuit boards 12 and the second set of circuit boards 14. The number of circuit boards in the set 12 may be the same or different from the number of circuit boards in the set 14, without departing from the spirit of the invention.

The circuit boards in each of the sets 12, 14 extend side by side. Mutual parallelism is a specific example of a side-by-side relationship.

The circuit boards in the first set 12 are non-parallel with relation to the circuit boards of the second set 14. It is advantageous to locate the circuit boards in the first set 12 such that they are orthogonal with relation to the circuit boards of the second set 14. This orthogonal relationship is not essential and other angular arrangements between the sets 12, 14 are possible without departing from the spirit of the invention.

When the data processing apparatus 10 is in the form of a router, the set of circuit boards 12 can be port circuit boards and the set of circuit boards 14 can be switching circuit boards. Evidently, the invention is not limited to this arrangement.

Figure 2:
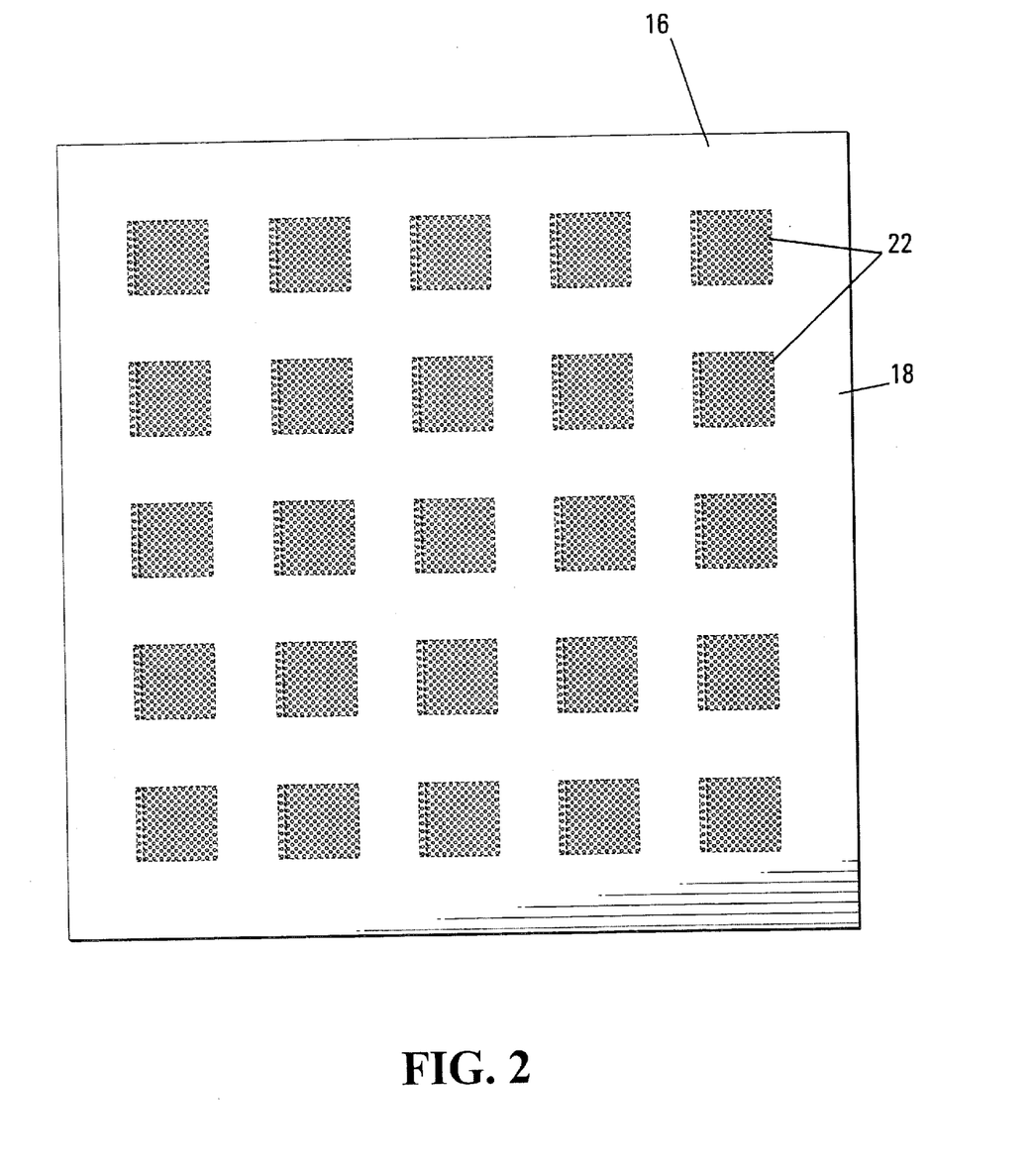
FIG. 2 is a plan elevational view of a midplane of the data processing apparatus shown in FIG. 1.

FIG. 2 is a plan view of the midplane 16. The midplane 16 is a planar body and has a pair of main surfaces, namely a first main surface 18 and a second main surface 20 (not seen in FIG. 2) that is opposite and parallel to the first main surface 18. In this example of implementation of the invention, the midplane 16 has a dual role. Firstly, it forms a supporting structure to hold the sets of circuit boards 12, 14 in a predetermined spatial orientation. Second, it electrically connects the circuit board sets 12, 14 to one another.

Figure 3:
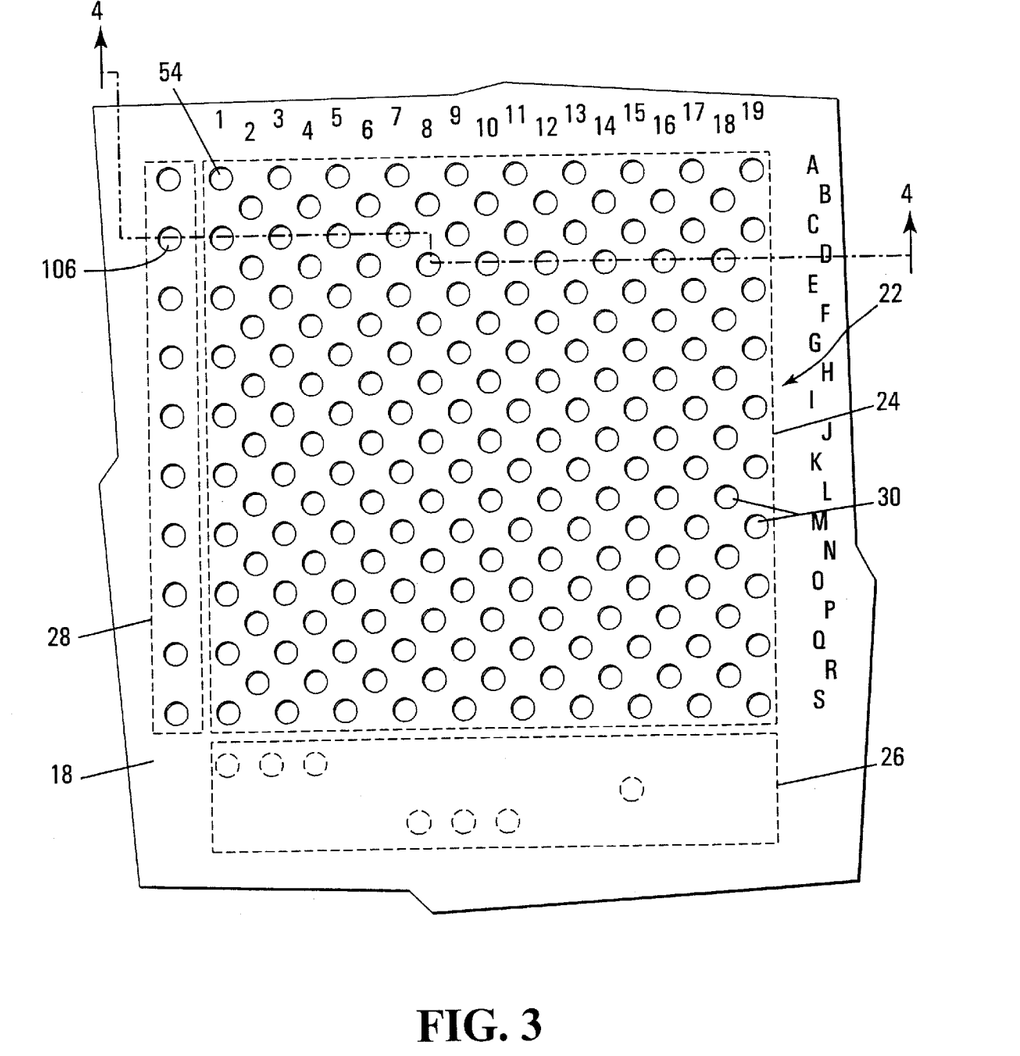
FIG. 3 is an enlarged, plan fragmentary view of an electrical connector of the midplane shown in FIG. 2. For ease of reference, FIG. 3 contains a designation system of letters and numerals allowing to reference individual electrical coupling elements of the connector. This designation system has only been provided to facilitate the description of the electrical connector and it does not form part of the invention.

The midplane 16 has a plurality of electrical connectors 22 arranged according to a matrix. The specific number of rows and columns of the matrix is not essential to the intention. FIG. 3 is an enlarged view of the midplane 16 illustrating an electrical connector 22 in detail. The electrical connector includes three main sections, namely a shared section 24, a first auxiliary section 26 and a second auxiliary section 28. The shared section 24 includes a set of electrical couplers 30 that establish electrical pathways from the first main surface 18 to the second main surface 20. The first auxiliary section 26 has a plurality of electrical terminals on the first main surface 18 of the midplane 16. The electrical terminals do not extend to the second main surface 20. Similarly, the second auxiliary section 28 has a plurality of electrical terminals on the second main surface 20 of the midplane 16. The electrical terminals do not extend to the first main surface 18.

Alternatively, the electrical terminals in the auxiliary sections 26, 28 may extend from, the main surface 18 to the main surface 20, as it will de discussed later.

Figure 5:
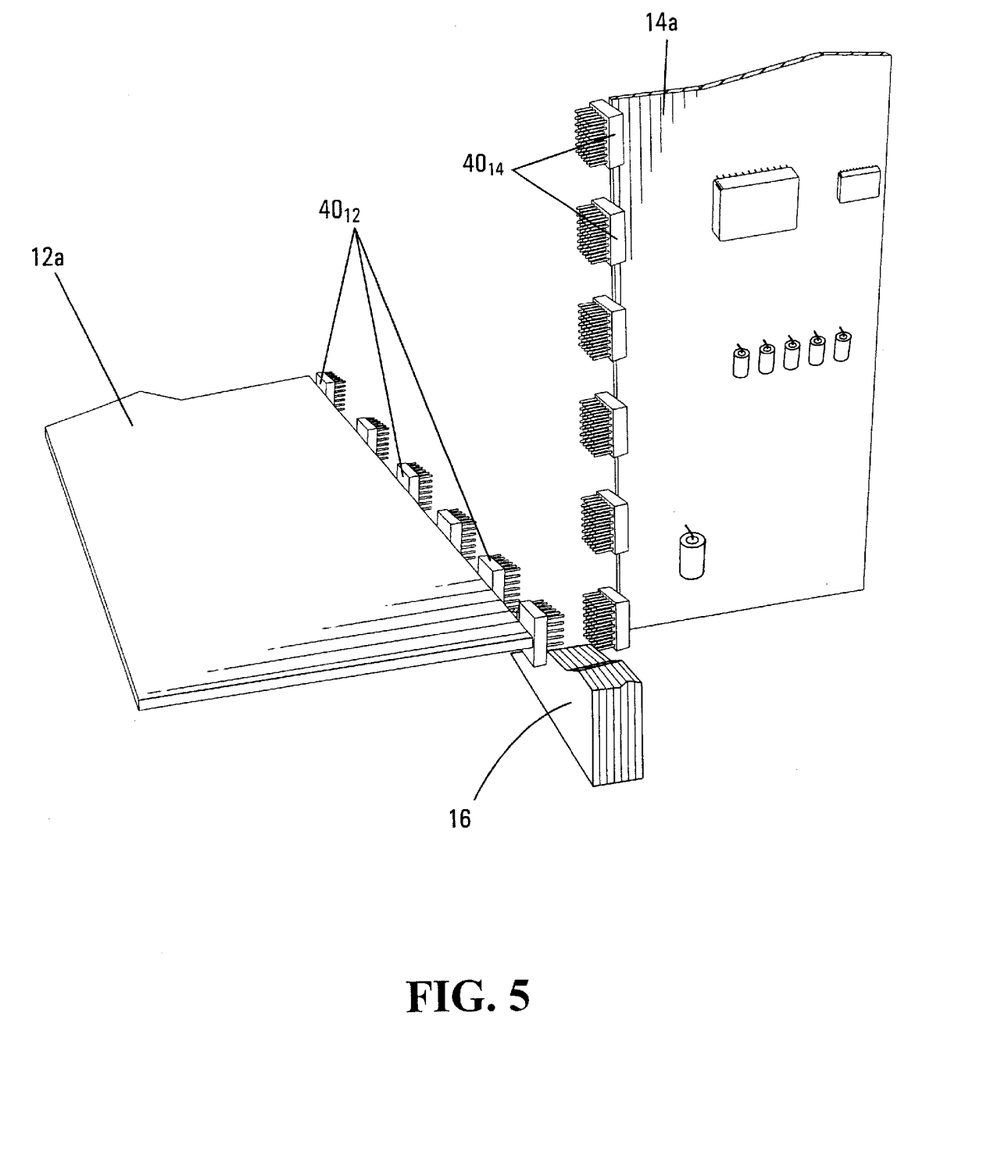
FIG. 5 is a perspective view illustrating the spatial relationship between one circuit board on one side of the midplane and another circuit board on the other side of the midplane, also showing the contact modules on the circuit boards.

FIG. 5 illustrates the circuit board 12a and the circuit board 14a when mounted to the midplane 16. For clarity, only a portion of the midplane 16 has been shown. The circuit board 12a has a plurality of contact modules $40_{12}$ mounted in a spaced apart relationship to a lower edge of the circuit board 12a. The contact modules $40_{12}$ have a plurality of electrical connection terminals that are electrically connected to components of the circuit board 12a. The detailed electrical diagram of how the individual terminals connect to the components on the circuit board depends on the specific data processing function the circuit board 12a performs, which is beyond the scope of this disclosure.

When the circuit board 12a is mounted to the midplane 16, every contact module $40_{12}$ on the lower edge of circuit board 12a engages a corresponding electrical connector 22 in the row of the matrix of electrical connectors along which the circuit board 12a extends. Thus, the circuit board 12a has a number of contact modules $40_{12}$ that matches the number of electrical connectors 22 in a single row.

The circuit board 14a is constructed in a manner similar to the circuit board 12a with the exception that the contact modules $40_{14}$ on the lower edge of the circuit board 14a fit in respective electrical connectors 22 in the column of the matrix of electrical connectors 22 along which the circuit board 14a extends. Thus, the circuit board 14a has a number of contact modules $40_{14}$ that matches the number of electrical connectors 22 in a single column.

It should be expressly noted that the invention is not limited to arrangements where the number of contact modules $40_{12}$, $40_{14}$ on each circuit board matches the number of electrical connectors 22 in a single row or in a single column of the midplane 16. Variants, where one or more circuit boards connect with only some of the electrical connectors 22 in a single row or column are encompassed within the present inventive concept.

Figure 4:
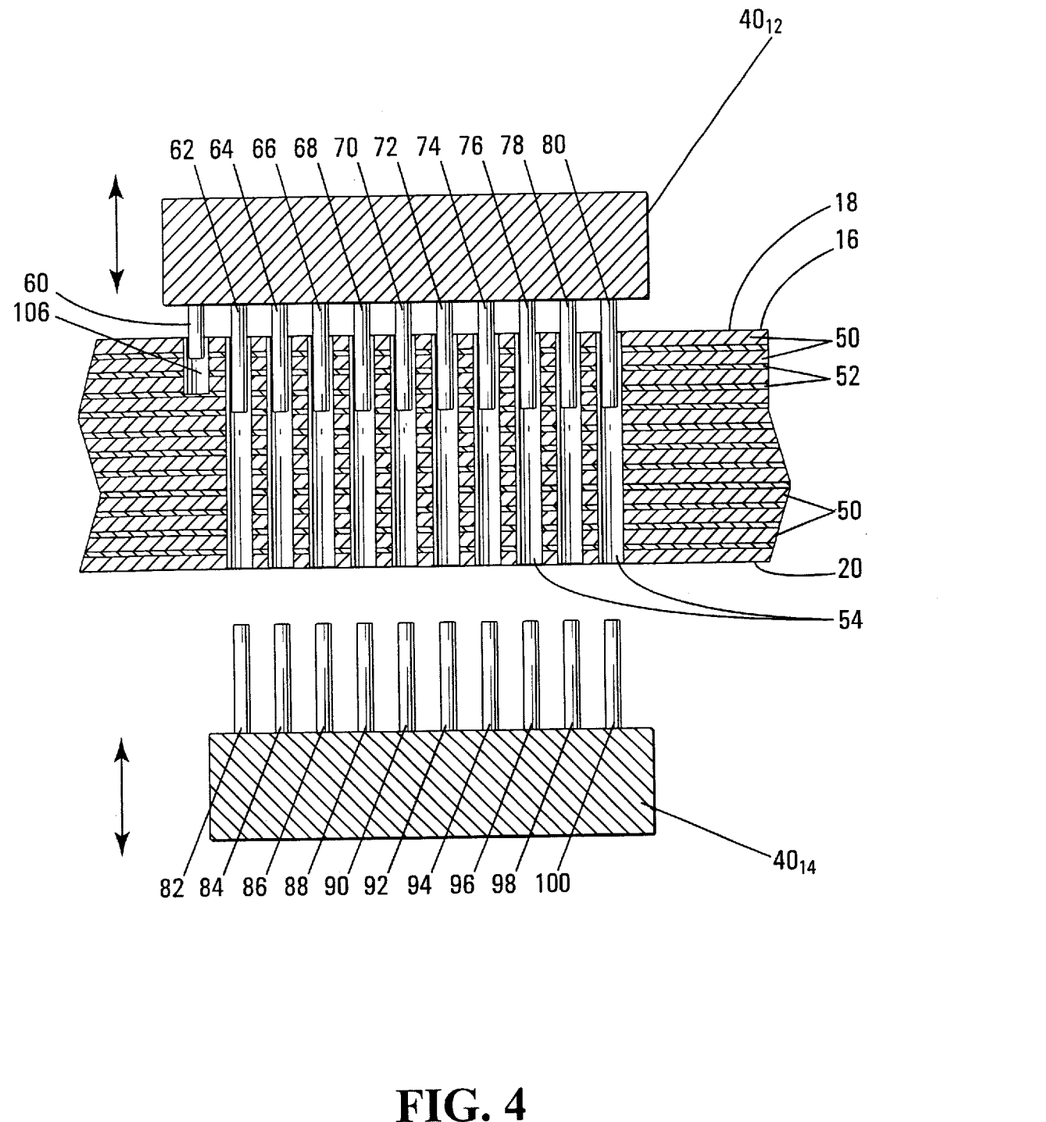
FIG. 4 is a vertical cross-sectional view taken along lines 4—4 in FIG. 3, also showing contact modules on the circuit boards that mate with the electrical connector.

FIG. 4 shows in detail the structure of an electrical connector 22 and the internal structure of the midplane 16. The midplane 16 is constructed as a circuit board and it includes a plurality of superposed insulating layers 50.

Between the insulating layers 50 are formed by photolithography patterns of electrically conductive material 52 such as copper foil to establish electrical pathways that extend in planes parallel to the main surfaces 18, 20. The number of insulating layers 50 and the patterns 52 can vary widely without departing from the spirit of the invention. In contrast to the patterns 52, the electrical couplers 30 extend perpendicularly to the main surfaces 18, 20. The electrical couplers 30 provide a direct electrical pathway from the main surface 18 to the main surface 20. Also the electrical couplers 30 establish electrical connections between patterns 52 located between different insulating layers 50, when such connections are required.

In one form of realization, the electrical couplers 30 are in the form of vias 54 The vias 54 are apertures that extend completely from the first main surface 18 to the second main surface 20. The peripheries of the apertures are coated with conductive material, such as tin-plated copper, to create electrically conductive cylinder-like structures.

The contact modules $40_{12}$, $40_{14}$ have a pin layout matching at least a portion of the layout of the vias 54 such that a contact module $40_{12}$, $40_{14}$ can be inserted in an electrical connector 22 where each pin penetrates and physically contacts a corresponding via 54. The arrangement of vias 54 is such that one contact module $40_{12}$ can be inserted from the first main surface 18 while another contact module $40_{14}$ can be inserted from the second main surface 20.

The electrical circuitry on one circuit board 12a, 12b, 12c, . . . 12j needs to connect with electrical circuitry on the circuit boards 14a, 14b, 14c, . . . 14j through data lines and ground lines. These data lines and ground lines appear on the contact modules $40_{12}$, $40_{14}$ in the form of data contacts and ground contacts associated to respective pins. When two contact modules $40_{12}$, $40_{14}$ connect to one another through an electrical connector 22, the data contacts and the ground contacts on the contact module $40_{12}$ electrically connect with corresponding data contacts and ground contacts of the other contact module $40_{14}$. The arrangement of pins and vias 54 is such that each pair of corresponding data pins on the two contact modules $40_{12}$, $40_{14}$ physically engage the same via 54. This means that the data signals propagate through the via 54 directly and do not follow the patterns 52. Consider the following specific and non-limiting example:

The contact module $40_{12}$ facing the main surface 18 has a plurality of pin rows, where one row has pins 60, 62, 64, 66, 68, 70, 72, 74, 76, 78 and 80. Pins 62, 64, 66, 68 are data pins. Pins 70, 72, 74, 76, 78 and 80 are ground pins (here "ground" should be construed in an unrestricted sense to mean a reference point that includes a true ground, chassis ground, etc.). The contact module $40_{14}$ facing the main surface 20 has a plurality of pin columns, where one column has pins 82, 84, 86, 88, 90, 92, 94, 96, 98 and 100. The pins 82, 84, 86 and 88 are data pins while the pins 90, 92, 94, 96, 98 and 100 are ground pins. The electrical connections that need to be established between the circuit boards on either side of the midplane 16 are as follows:

1. Data pin 62 corresponds to data pin 82;
2. Data pin 64 corresponds to data pin 84;
3. Data pin 66 corresponds to data pin 86;
4. Data pin 68 corresponds to data pin 88.

The layout of the data pins and the vias 54 is such that two corresponding data pins are in physical contact with a common via 54. The vias 54 that receive the ground pins from the contact modules $40_{12}$, $40_{14}$ are connected to one another by pathways 52, Since these vias 54 are all at the same voltage reference.

Figure 6A:
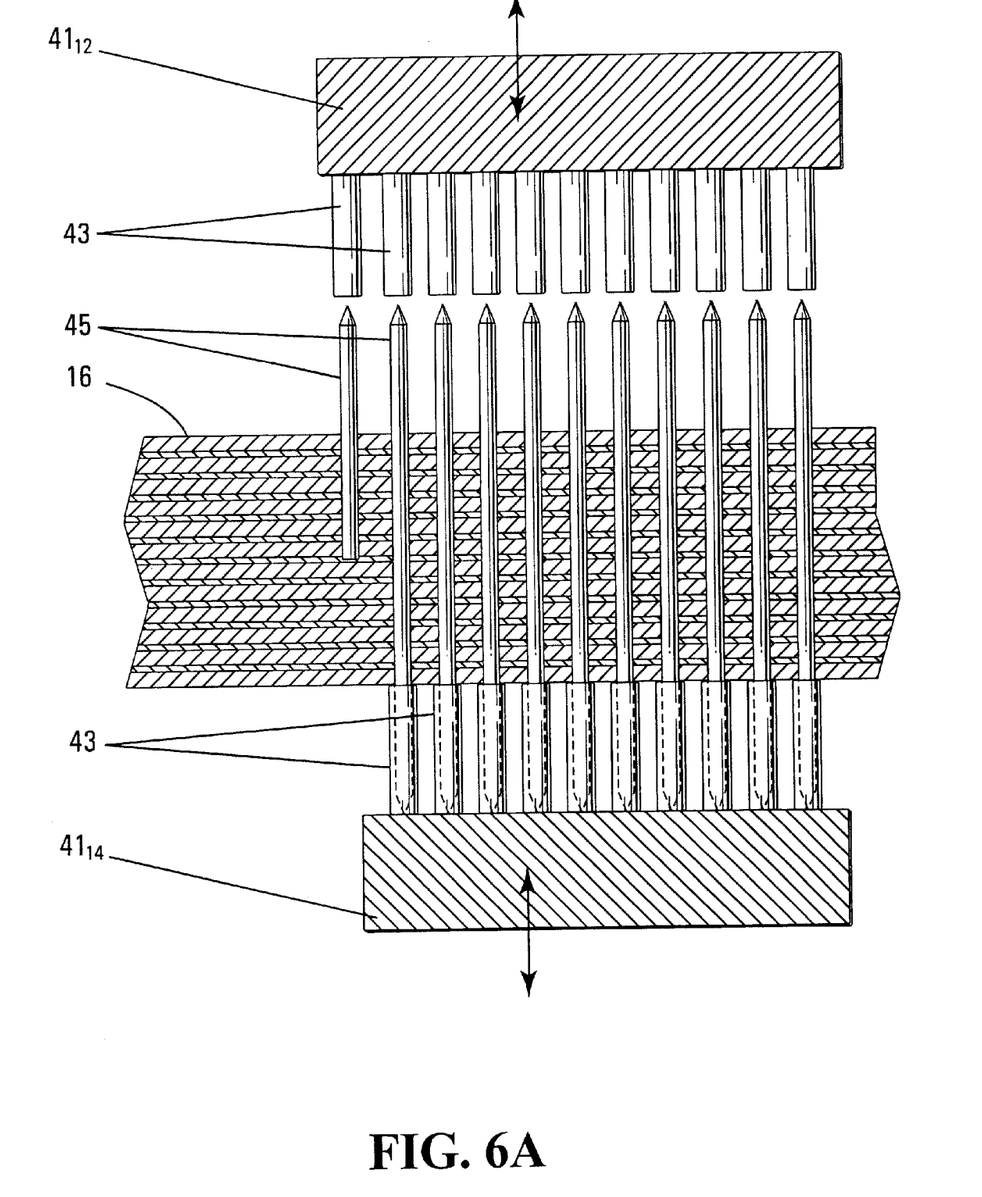
FIG. 6a is a vertical cross-sectional view of the midplane, similar to FIG. 4, but according to a second variant.
Figure 6B:
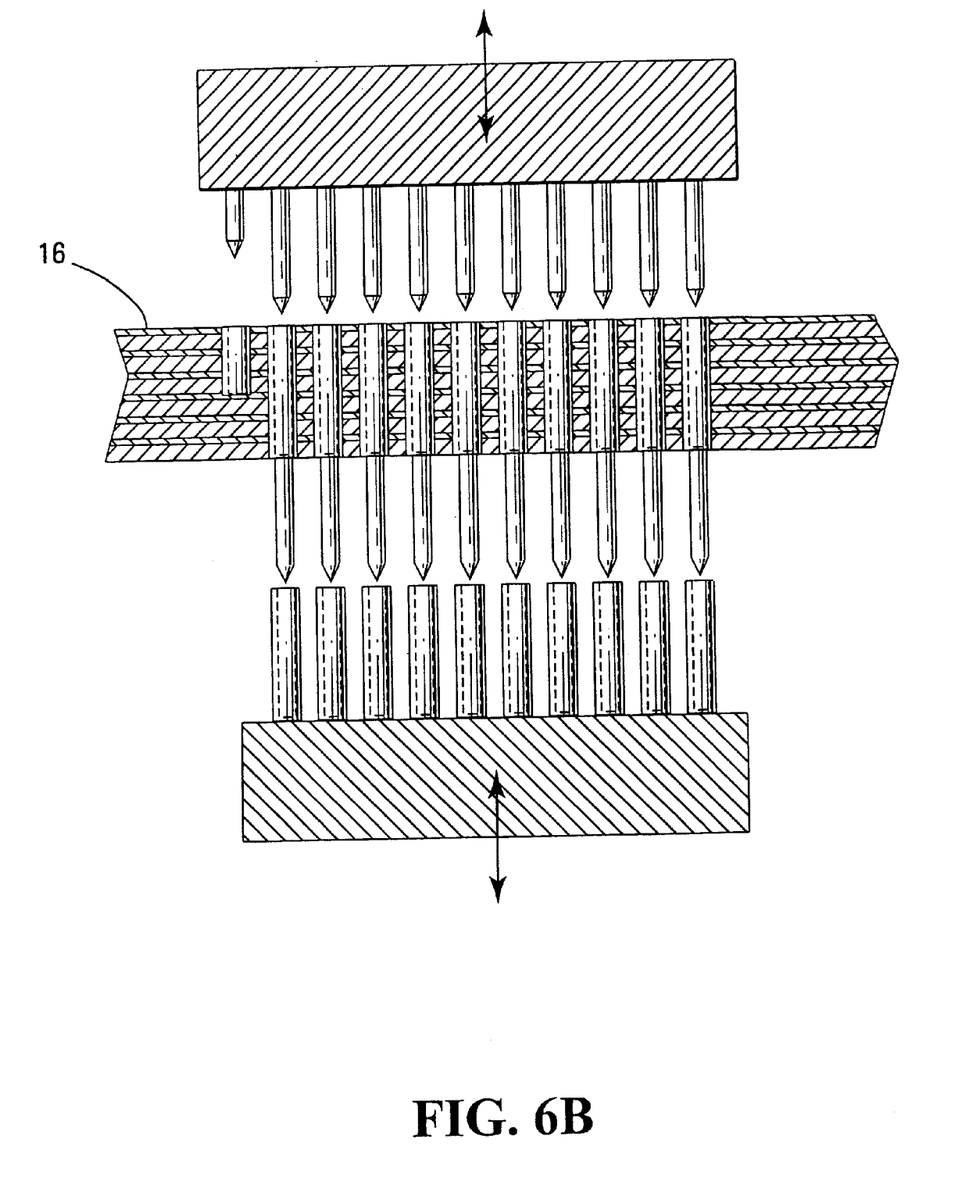
FIG. 6 is a vertical cross-sectional view of the midplane, similar to FIG. 4, but according to a first variant.

FIG. 6 shows a variant of the contact modules and the electrical connectors. In this embodiment, the electrical couplers are in the form of pins 45 that are perpendicular to the surfaces of the midplane 16. The contact modules $41_{12}$, $41_{14}$ have sockets 43 that receive the pins 45. As shown in FIG. 6a a hybrid form of construction is also possible, where the electrical couplers are shaped as vias, or more generally as sockets on one side of the midplane 16, while shaped as pins at the other side of the midplane 16.

It should be expressly noted that the specific form of engagement between the contact modules and the electrical couplers is not an essential element of the invention. The form of engagement can vary widely according to the intended application. In the examples described earlier, male and female type of connections were mentioned. Those can be removable or permanent. Other types of connections, removable or permanent, will become apparent to the reader skilled in the art.

Referring back to FIGS. 3 and 4, the contact module $40_{12}$ facing the side 18 of the midplane 16 includes an additional pin designated 60 that engages an electrical terminal in the form of a via 106. The via 106 belongs to the first auxiliary section 28. It will be noted that the via 106 does not extend to the face 20 of the midplane and it is used exclusively by the contact module $40_{12}$ facing the side 18. All the electrical terminals of the auxiliary section 28 provide local connectivity that does not extend to the, other side of the midplane 16. In a specific example of implementation, this local connectivity is used to transport control signals and/or power signals through the conductive patterns 52. The construction of the auxiliary section 26 is the same as the auxiliary section 28 with the exception of the layout of the electrical terminals and the location of the each section on the midplane. Note that the layout of the electrical terminals in both auxiliary sections 26, 28 can be the same without departing from the spirit of the invention. It will be observed that the electric terminals of the section 28 are accessed from the side 18 of the midplane 16, while the electric terminals of the section 26 are accessed from the side 20 of the midplane 16. The auxiliary sections 28 and 26 are non-overlapping, but this is not essential.

As mentioned previously, the electric terminals of the auxiliary sections 24, 26 can extend from the main surface 18 to the main surface 20. To avoid an undesirable contact between the electric terminals of the auxiliary section 26 and the contact module $40_{14}$, the contact module $40_{14}$ is designed such that no pins or sockets thereof physically engage any part of the vias or pins of the electric terminals of the auxiliary section 26 that project on the main surface 20. The same arrangement is also made with respect to the contact module $40_{12}$ and the electric terminals of the auxiliary section 28.

Another advantageous but non-essential feature of the invention is shown in FIG. 3. The vias 54 at the shared section 24 are arranged in an array that has a periphery formed by pins A1, A3, A7, A9, A11, A13, A15, A17, A19, C19, E19, G19, I19, K19, M19, O19, Q19, S19, S17, S15, S13, S11, S9, S7, S5, S3, S1 Q1, O1, M1, K1, I1, G1, E1, C1. The vias 54 at the periphery connect to ground contacts of the circuit boards that interconnect through the shared section 24. This disposition creates a peripheral shielding structure surrounding the vias 54 that carry the data signals to prevent or at least reduce the likelihood of signal corruption due to external electromagnetic radiation.

The same idea is also extended to the individual vias 54 to which connect data contacts from circuit boards mounted to opposite sides of the midplane 16. Under this variant, the connection layout is such that the vias 54 that carry data signals ("data vias") are surrounded by vias 54 to which connect ground contacts ("ground vias"). In FIG. 3, the data vias are designated by "+", while the ground vias are designated by "−". Other possibilities exist also. Instead of surrounding each data via, the data vias can be arranged into sub-groups, where each sub-group is surrounded by ground vias. Under another variant, the ground vias can be interspersed with the data vias. This approach may provide a lesser degree of shielding by comparison to an arrangement where the individual data vias or sub-groups of data vias are surrounded by ground vias, but it may constitute a practical alternative when the number of available vias 54 that can be used as ground vias is limited.

Figure 7:
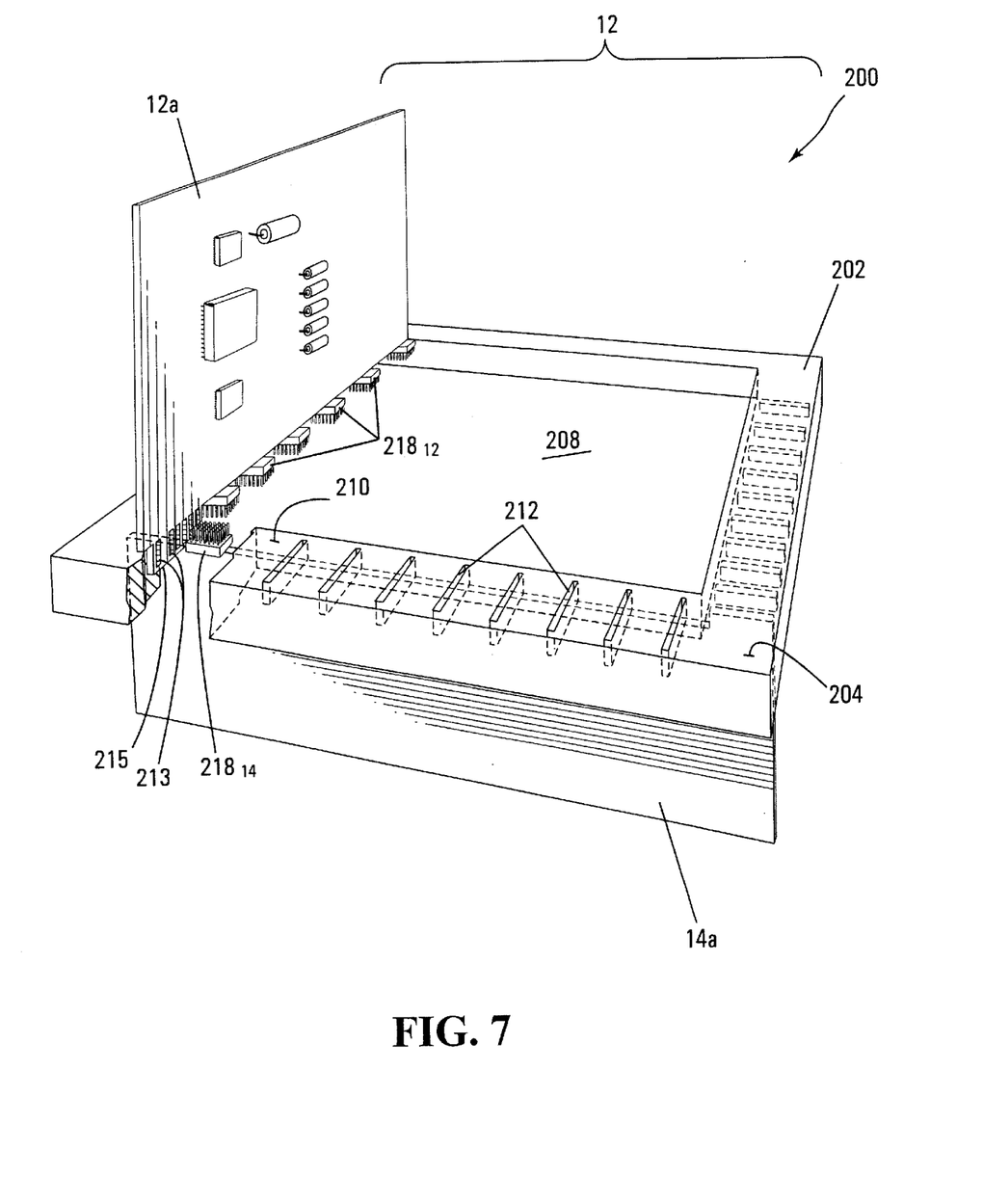
FIG. 7 is a fragmentary perspective view of a data processing apparatus constructed in accordance with another embodiment of the present invention.

FIG. 7 illustrates a data processing apparatus according to another embodiment of the invention. The data processing apparatus 200 is in the farm of a router that includes a first set 12 of circuit boards (only the circuit board 12*a* is shown for clarity), a second set 14 of circuit boards (only the circuit board 14*a* is shown for clarity) and a midplane 202 between the sets 12, 14 of circuit boards. The circuit boards 12*a*, 12*b*, 12*c*, etc., are generally orthogonal to the circuit boards 14*a*, 14*b*, 14*c*, etc.

The midplane 202 is generally flat with two main sides, 204 and 206 (206 not shown in FIG. 7). It has a central void area 208. The sets 12, 14 of circuit boards intersect the void area 208. On a portion 210 of the side 204 of the midplane 202 that is remote from the void area 208 are formed a plurality of electrical connectors 212. Each electrical connector 212 is in the form of a socket that receives a mating tongue 215 from a corresponding circuit board from the set 12 of circuit boards and establishes electrical contact with electric terminals 213 of the circuit board. Note that the gender can be reversed without departing from the spirit of the invention, where the sockets can be formed on the circuit boards and the tongues on the midplane 202. It is also possible to alternate the gender of the electrical connectors 212, for instance, one electrical connector 212 is in the form of a socket, the next in the form of a tongue, etc.

The tongue/socket engagement that arises when the electrical connector 212 receives the mating tongue of a circuit board serves, in addition to providing electrical connectivity, to create a mechanical fastening and aligning structure that receives and retains the circuit board to the midplane 202 in a predetermined disposition. As a variant, the electrical connector 212 can be supplemented with an additional alignment/fastening arrangement such as any suitable pins, brackets etc., engaging a portion of the circuit board that is remote from the electrical connector 212, such as to make the circuit board more stable on the midplane 202.

Figure 8:
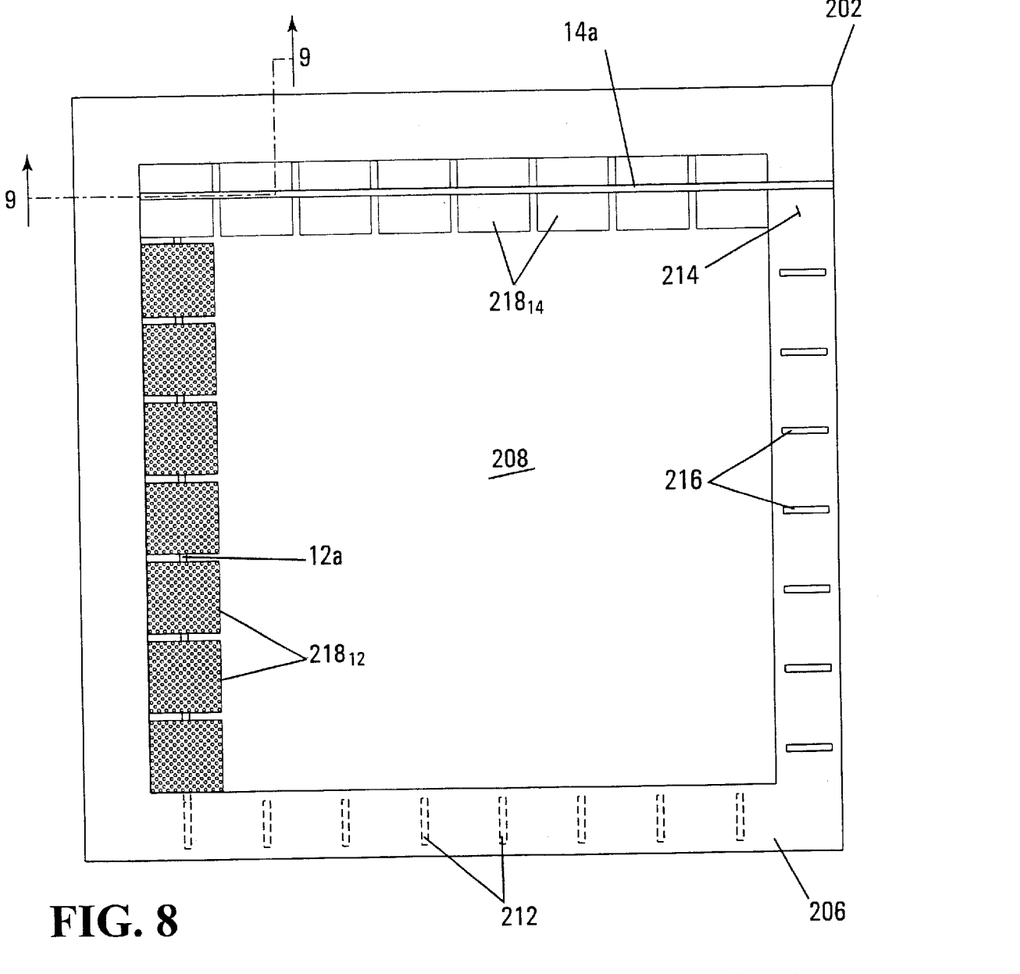
FIG. 8 is a plan elevational view of the midplane of the data processing apparatus shown in FIG. 7.

The embodiment illustrated in the drawings has provisions for a single electrical connector 212 per circuit board. Alternatively, two or more electrical connectors 212 per circuit board can be provided on the midplane 202. One possible example involves separating the electrical connectors 212 in rows placed on either side of the void area 208 and aligned in pairs, each pair of electrical connectors 212 receiving mating tongues formed on a common circuit board.

The side 206 includes a portion 214, similar to the portion 210 that has electrical connectors 216 receiving circuit boards from the set 14 of circuit boards.

Each circuit board from the set 12 intersects each circuit board from the set 14 and connects therewith through a set of electrical pathways that establish a data communicative relationship between the two circuit boards. Hence, each circuit board from the set 12 can enter into a data communicative relationship with every circuit board of the set 14. As discussed previously, a data communicative relationship entails the exchange of data signals and possibly includes one or more ground paths as well. Note that it is not essential that each circuit board from the set 12 communicates with every circuit board from the set 14. Embodiments, where a circuit board from the set 12 communicates with none, some or all of the circuit boards from the set 14 are encompassed by the invention.

A data communicative relationship between two circuit boards that belong to the sets 12, 14 can be established in a variety of ways. One possibility is to provide contact modules on the lower edge of each circuit board. The contact modules on the circuit boards of the set 12 are designated $218_{12}$ while the contact modules on the circuit boards of the set 14 are designated $218_{14}$.

The contact modules $218_{12}$, $218_{14}$ are located at the points of intersection between the circuit cards where data connections are to be made. Corresponding contact modules $218_{12}$, $218_{14}$ register with one another and mate with one another to establish electrical pathways between the respective circuit boards from the sets 12, 14.

Those electrical pathways are located within the void area 208, The contact modules $218_{12}$, $218_{14}$ can be made permanent or releasable, without departing from the spirit of the invention.

Figure 9:
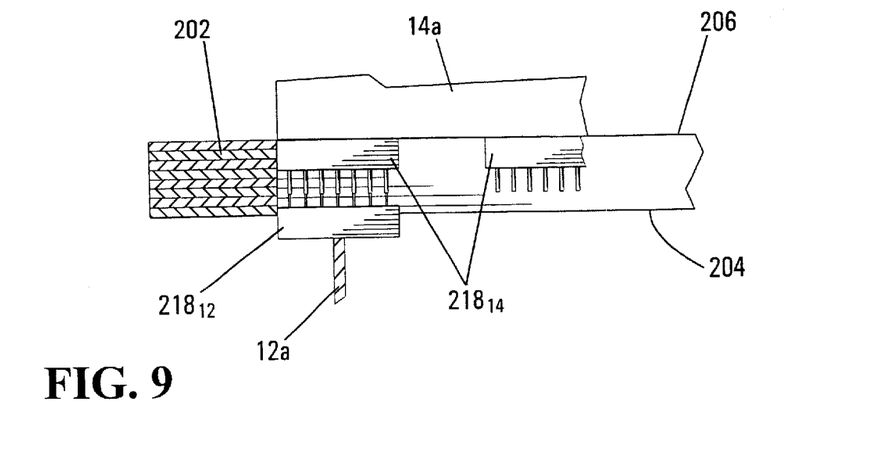
FIG. 9 is a cross-sectional view taken along lines 9—9 in FIG. 8.

The embodiment of the invention shown at FIG. 9 shows mating contact modules $218_{12}$, $218_{14}$ where the engagement between the contacts of the contact modules $218_{12}$, $218_{14}$ is of the male/female type. Evidently, other types of arrangements are possible without departing from the spirit of the invention.

The structure of the midplane 202 is similar to the structure of the midplane 16 described earlier. More particularly, the midplane 202 is a layered structure including a plurality of layers between which are mounted patterns of copper foil that provide connections for the electrical contacts 212 and 216. Generally, the electrical contacts 212 and 216 transport electrical flows for purposes other than exchange of data from one circuit board to another circuit board. Such purposes can include supplying power to components of the circuit boards or supplying control signals to the circuit boards, In the case of control signals, an additional connector (not shown) will likely be required on the midplane 202 to connect to the device sending such control signals.

In another variant not shown in the drawings, the electrical connectors 212, 216 lack any electrical terminals therein. Similarly, the circuit boards from the sets 12, 14 are provided with mating tongues without any terminals thereon. Under this arrangement, the slots and tongues constitute an attachment and alignment system for securing and locating the circuit boards on the midplane 202, and all the connections such as data, power and control signals are effected directly from one circuit board to another through the void area 208.

Under yet another possibility, not shown in the drawings, the electrical connectors on the midplane 202 lack any mechanical fastening capability and they are provided solely for establishing electrical connections with the circuit boards. The circuit boards are mechanically fastened to the midplane by using any suitable agency, such as brackets, that is independent from the electrical connectors.

The above description of the embodiment shown in FIGS. 7, 8 and 9 refers to electrical connectivity between the circuit boards from the set 12 to circuit boards of the set 14 and to electrical connectivity between the circuit boards from the sets 12, 14 and the electrical connectors 212, 216. In a possible variant, such electrical connectivity can be replaced by an optical connectivity, without departing from the spirit of the invention.

Although various embodiments have been illustrated, this was for the purpose of describing, but not limiting, the invention. Various modifications will become apparent to those skilled in the art and are within the scope of this invention, which is defined more particularly by the attached claims.

What is claimed is:

1. A data processing apparatus, comprising:
   a. a first plurality of circuit boards arranged generally side-by-side;
   b. a second plurality of circuit boards arranged generally side-by-side;
   c. a midplane having a first main surface, a second main surface and a plurality of connector elements, each connector element including a plurality of electrical couplers extending generally transversally to said first and said second main surfaces;
   d. said first plurality of circuit boards being mounted to said midplane at said first main surface;
   e. said second plurality of circuit boards being mounted to said midplane at said second main surface and being in a non-parallel relationship relative to said first plurality of circuit boards;
   f. said plurality of electrical couplers electrically connecting one circuit board from said first plurality of circuit boards to another circuit board from said second plurality of circuit boards;
   g. one of said one circuit board from said first plurality of circuit boards and another circuit board from said second plurality of circuit boards including a plurality of data contacts and at least one ground contact;
   h. the data contacts of said one circuit board being electrically connected to corresponding data contacts of said another circuit board via the plurality of electrical couplers to establish a data communication between said one circuit board and said another circuit board;
   i. each data contact of said one circuit board and each corresponding data contact of said another circuit board being in physical contact with a common electrical coupler of the plurality of electrical couplers;
   wherein said plurality of electrical couplers includes a first group of electrical couplers and a second group of electrical couplers;
   wherein the electrical couplers of said first group are connected to data contacts of circuit boards from said first plurality of circuit boards and to data contacts of circuit boards from said second plurality of circuit boards;
   wherein the electrical couplers of said second group are connected to ground contacts of circuit boards from said first plurality of circuit boards and to ground contacts of circuit boards from said second plurality of circuit boards; and
   wherein electrical couplers of said first group are surrounded by electrical couplers of said second group.

2. A data processing apparatus as defined in claim 1, wherein each electrical coupler extends generally transversally to said first and second main surfaces.

3. A data processing apparatus as defined in claim 1, wherein said one circuit board is a port circuit board and said another circuit board is a switching circuit board.

4. A data processing apparatus as defined in claim 1, wherein said plurality of electrical couplers form an array having a peripheral portion, electrical couplers at said peripheral portion being connected to ground contacts of circuit boards from said first plurality of circuit boards and said second plurality of circuit boards to form a shield.

5. A data processing apparatus as defined in claim 1 wherein said one circuit board is a port circuit board and said another circuit board is a switching circuit board.

6. A data processing apparatus as defined in claim 2, wherein each electrical coupler is selected from a group consisting of:
   (i) a via;
   (ii) a pin projecting from one main surface of said midplane; and
   (iii) a combination of a via and a pin.

7. A data processing apparatus as defined in claim 6, wherein said midplane includes a plurality of electrical pathways extending generally parallel to said first and said second main surfaces and electrically connected to electrical couplers of said plurality of electrical couplers.

8. A data processing apparatus as defined in claim 7, wherein said midplane is a multi-layer circuit board arrangement.

9. A data processing apparatus as defined in claim 8, wherein each one of said one circuit board and another circuit board includes a plurality of ground contacts physically connected to electrical couplers of said plurality of electrical couplers.

10. A data processing apparatus as defined in claim 9, the electrical couplers to which are connected the ground contacts being electrically connected to one another via at least one of said electrical pathways.

11. A data processing apparatus as defined in claim 10, wherein said one circuit board is generally orthogonal to said another circuit board.

12. A data processing apparatus as defined in claim 11, wherein said connector element includes a first auxiliary section on said first main surface including electric terminals and a second auxiliary section on said second main surface including electric terminals, said first and second auxiliary sections being in a non-overlapping relationship.

13. A data processing apparatus as defined in claim 12, wherein at least one electric terminal of said first auxiliary section is remote from said second main surface.

14. A data processing apparatus, comprising:
   a. a first plurality of circuit boards arranged generally side-by-side;
   b. a second plurality of circuit boards arranged generally side-by-side;
   c. a midplane having a first main surface, a second main surface and a plurality of connector elements, each connector element including a plurality of electrical couplers;
   d. said first plurality of circuit boards being mounted to said midplane at said first main surface;
   e. said second plurality of circuit boards being mounted to said midplane at said second main surface;
   f. said plurality of electrical couplers electrically connecting one circuit board from said first plurality of circuit boards to another circuit board from said second plurality of circuit boards;
   g. one of said one circuit board from said first plurality of circuit boards and another circuit board from said second plurality of circuit boards including a plurality of data contacts and at least one ground contact;

h. the data contacts of said one circuit board being electrically connected to corresponding data contacts of said another circuit board via the plurality of electrical couplers to establish a data communication between said one circuit board and said another circuit board;

i. each data contact of said one circuit board and each corresponding data contact of said another circuit board being in physical contact with a common electrical coupler of the plurality of electrical couplers;

j. wherein said plurality of electrical couplers includes a first group of electrical couplers and a second group of electrical couplers, wherein the electrical couplers of said first group are connected to data contacts of circuit boards from said first plurality of circuit boards and to data contacts of circuit boards from said second plurality of circuit boards, wherein the electrical couplers of said second group are connected to ground contacts of circuit boards from said first plurality of circuit boards and to ground contacts of circuit boards from said second plurality of circuit boards, and wherein electrical couplers of said first group are surrounded by electrical couplers of said second group.

15. A data processing apparatus as defined in claim 14, wherein each electrical coupler extends generally transversally to said first and second main surfaces.

16. A data processing apparatus as defined in claim 14, wherein said one circuit board is a port circuit board and said another circuit board is a switching circuit board.

17. A data processing apparatus as defined in claim 14,
wherein each one of said one circuit board and another circuit board includes a plurality of ground contacts physically connected to electrical couplers of said plurality of electrical couplers;

wherein said plurality of electrical couplers form an array having a peripheral portion; and wherein electrical couplers at said peripheral portion are connected to ground contacts of circuit boards from said first plurality of circuit boards and said second plurality of circuit boards to form a shield.

18. A data processing apparatus as defined in claim 15, wherein each electrical coupler is selected from a group consisting of:

(i) a via;

(ii) a pin projecting from one main surface of said midplane; and (iii) a combination of a via and a pin.

19. A data processing apparatus as defined in claim 18, wherein said midplane includes a plurality of electrical pathways extending generally parallel to said first and second main surfaces and electrically connected to electrical couplers of said plurality of electrical couplers.

20. A data processing apparatus as defined in claim 19, wherein said midplane is a multi-layer circuit board arrangement.

21. A data processing apparatus as defined in claim 20, wherein each one of said one circuit board and another circuit board includes a plurality of ground contacts physically connected to electrical couplers of said plurality of electrical couplers.

22. A data processing apparatus as defined in claim 21, the electrical couplers to which are connected the ground contacts being electrically connected to one another via at least one of said electrical pathways.

23. A data processing apparatus as defined in claim 22, wherein said one circuit board is generally orthogonal to said another circuit board.

24. A data processing apparatus as defined in claim 23, wherein said connector element includes a first auxiliary section on said first main surface including electric terminals and a second set of auxiliary contact elements on said second main surface including electric terminals, said first and second auxiliary sections being in a non-overlapping relationship.

25. A data processing apparatus as defined in claim 24, wherein at least one electric terminal of said first auxiliary section is remote from said second main surface.

26. A data processing apparatus, comprising:

a. a plurality of circuit boards arranged generally side-by-side;

b. a connector plane having a main surface and a plurality of connector elements, each connector element including a plurality of electrical couplers extending generally transversally to said main surface;

c. said plurality of circuit boards being mounted to said midplane at said main surface;

d. said plurality of electrical couplers electrically connecting one circuit board from said plurality of circuit boards to another circuit board from said plurality of circuit boards;

e. one of said one circuit board from said plurality of circuit boards and another circuit board from said plurality of circuit boards including a plurality of data contacts and at least one ground contact;

f. the data contacts of said one circuit board being electrically connected to corresponding data contacts of said another circuit board via the plurality of electrical couplers to establish a data communication between said one circuit board and said another circuit board;

g. each data contact of said one circuit board and each corresponding data contact of said another circuit board being in physical contact with a common electrical coupler of the plurality of electrical couplers;

h. wherein said plurality of electrical couplers includes a first group of electrical couplers and a second group of electrical couplers, wherein the electrical couplers of said first group are connected to data contacts of circuit boards from said plurality of circuit boards, wherein the electrical couplers of said second group are connected to ground contacts of circuit boards from said plurality of circuit boards, and wherein electrical couplers of said first group are surrounded by electrical couplers of said second group.

* * * * *